United States Patent [19]

Kawashima

[11] Patent Number: 5,001,383
[45] Date of Patent: Mar. 19, 1991

[54] LONGITUDINAL QUARTZ CRYSTAL RESONATOR

[75] Inventor: Hirofumi Kawashima, Sendai, Japan

[73] Assignee: Seiko Electronic Components Ltd., Japan

[21] Appl. No.: 404,324

[22] Filed: Sep. 7, 1989

[30] Foreign Application Priority Data

Sep. 9, 1988 [JP] Japan ................................ 63-226778
Sep. 14, 1988 [JP] Japan ................................ 63-230484
Nov. 14, 1988 [JP] Japan ................................ 63-286968

[51] Int. Cl.⁵ .......................................... H01L 41/08
[52] U.S. Cl. .................................... 310/367; 310/361; 310/368
[58] Field of Search ............... 310/367, 368, 360, 361, 310/366, 320, 323

[56] References Cited

U.S. PATENT DOCUMENTS 4,350,918 9/1982 Sato ..................................... 310/367
4,633,124 12/1986 Kawashima ..................... 310/361 X

FOREIGN PATENT DOCUMENTS 0052621 4/1980 Japan .................................. 310/368
0218022 12/1984 Japan .................................. 310/367
2043995 10/1980 United Kingdom .
2102199 1/1983 United Kingdom .
2117968 10/1983 United Kingdom .

Primary Examiner—Mark O. Budd
Attorney, Agent, or Firm—Bruce L. Adams; Van C. Wilks

[57] ABSTRACT

A small longitudinal quartz crystal resonator has an intermediate oscillating frequency from 500 KHz to 4.2 MHz, a reduced energy loss of vibration, a small equivalent series resistance and zero temperature coefficient. The resonator has a longitudinal vibrational portion of rod-like shape connected at its central portion to a pair of supporting portions through each bridge portion. Each supporting portion is shaped to avoid suppression of oscillation of the vibrational portion. The vibrational and supporting portions are formed integrally by etching method. Driving electrodes are formed on etched faces of the vibrational portion perpendicular to X-axis. The resonator is composed of a quartz crystal plate cut out by cut angle of −2° to +4° around X-axis with respect to a Z-plate. The vibrational portion may have tapered end portions to increase the oscillating frequency in high frequency range up to 4.2 MHz.

14 Claims, 3 Drawing Sheets

FIG. 1
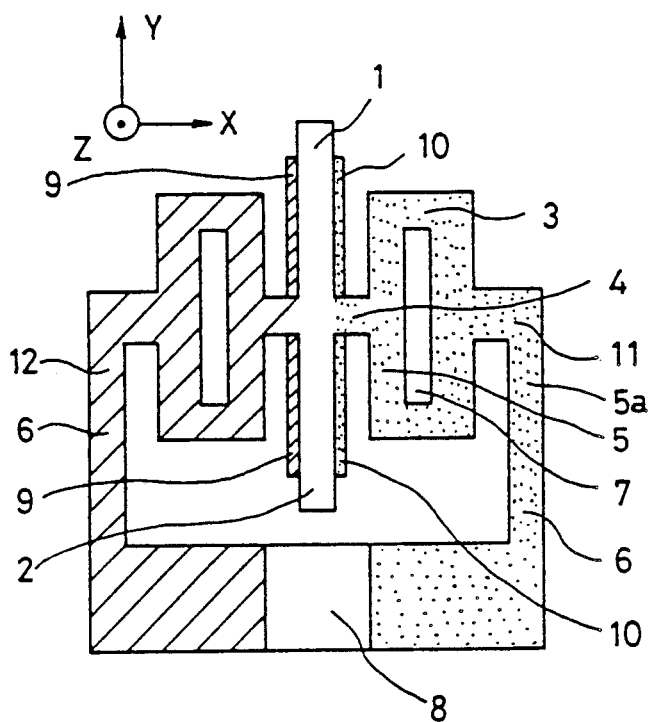
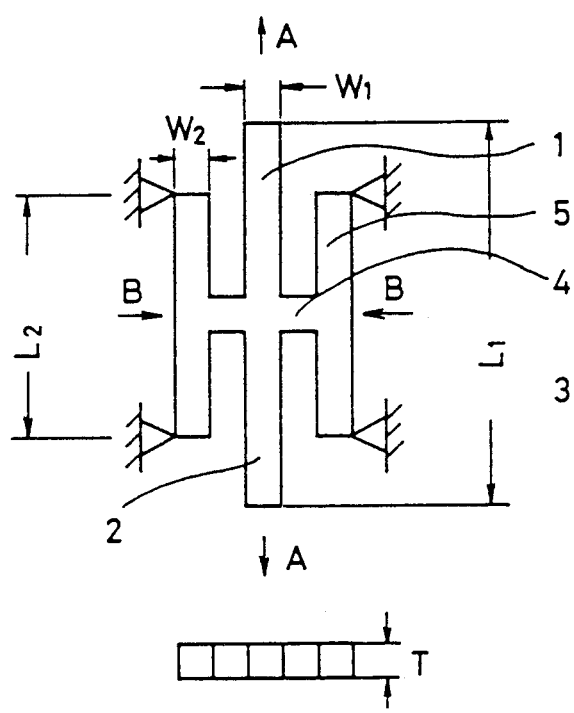
FIG. 2

FIG. 3
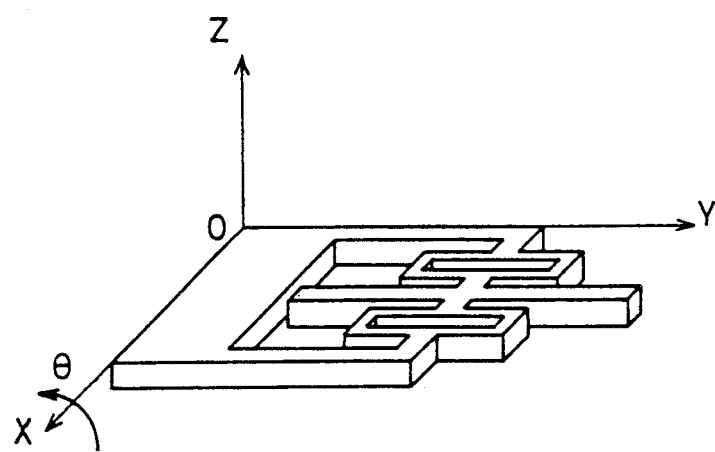
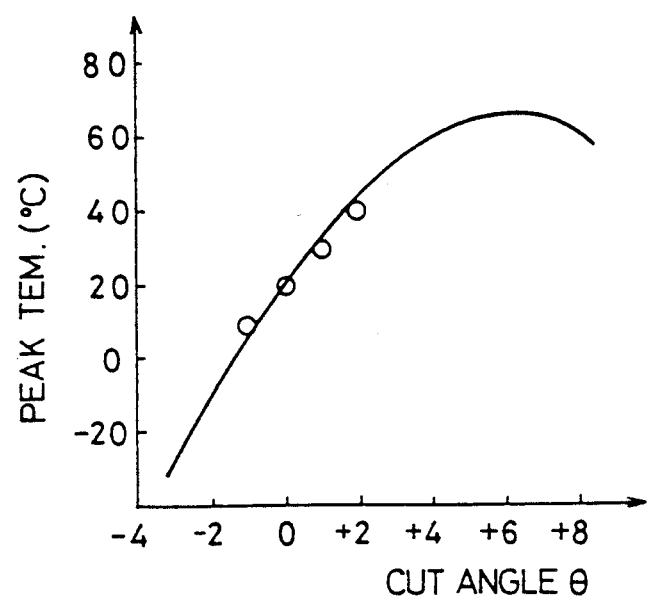
FIG. 4

LONGITUDINAL QUARTZ CRYSTAL RESONATOR

BACKGROUND OF THE INVENTION

The present invention relates to longitudinal quartz crystal resonators having an intermediate oscillating frequency range from 500 KHz to 4.2 MHz, and more specifically relates to the shape of the resonator, structure of the driving electrodes and cut angle. Recently, intensive research has been undertaken for this type of resonator. The longitudinal quartz resonator is most suitable for a clock signal source in portable devices such as as paging device and IC card.

The conventional longitudinal quartz crystal resonator is comprised of a vibrational portion and a supporting portion formed integrally with each other by an etching method. The supporting portion has a uniform width, extends in a unidirection and is mounted at its rear section. Therefore, energy of the vibrational portion is transmitted to the mounting section, thereby causing vibration energy loss. Consequently, it is difficult to produce a longitudinal quartz crystal resonator having a small equivalent series resistance $R_1$.

Another type of conventional non-longitudinal quartz crystal resonator is disclosed in U.S. Pat. Nos. 4,484,382 and 4,633,124. This type of resonator has a specific supporting portion designed to suppress vibration energy loss.

As mentioned above, the conventional shape of longitudinal quartz crystal resonator causes a considerable vibration energy loss. Consequently, it is difficult to form the longitudinal quartz crystal resonator having a small equivalent series resistance $R_1$. In addition, a reduction of the size for an increase in oscillating frequency would seriously affect various electric characteristics of the supporting portion to thereby hinder the oscillating feature of the resonator.

SUMMARY OF THE INVENTION

An object of the present invention is to, therefore, solve the problems of the conventional longitudinal resonator. According to the present invention, in the longitudinal quartz crystal resonator comprised of a vibrational portion and a supporting portion formed integrally with each other by an etching method, the vibrational portion of the resonator has a longitudinal shape and opposed sides of the vibration portion are connected through respective bridge portions to respective flexural sections of the supporting portion. Further, the respective flexural section is connected through a connecting section defining therein an opening to as frame section, which is extended to a mounting section. The vibrational portion is formed at its etched side faces perpendicular to X-axis of the crystal system with driving electrodes. The planer resonator is formed of a plate cut out by an angle in the range of $-2°$ to $4°$ around X-axis with respect to a Z-plate.

As described above, the inventive longitudinal quartz crystal resonator has a vibrational portion of the longitudinal or rod-like shape, and a pair of supporting portions connected to the opposite sides of the vibrational portion and effective to avoid suppression of the vibration, and further the vibrational and supporting portions are formed integrally with each other by the etching method, thereby realizing a longitudinal quartz crystal resonator having a good shock-resistance, a reduced energy loss of vibration, a reduced size, a small equivalent series resistance $R_1$ and a high Q value. Moreover, the resonator is composed of quartz crystal as material to thereby ensure good aging characteristic and high stability of oscillating frequency.

BRIEF DESCRIPTION OF THE DRAWINGS

FIG. 1 is a plan view of the inventive longitudinal quartz crystal resonator showing the shape and dimension thereof and arrangement of driving electrodes;

FIG. 2 is a diagrammatic plan view of the inventive longitudinal quartz crystal resonator illustrating oscillation operation thereof;

FIG. 3 is a diagram showing the coordinate system used to analyze the inventive longitudinal quartz crystal resonator and the frequency-temperature characteristic thereof;

FIG. 4 is a diagram showing the relation between the peak temperature ($T_p$) and cut angle $\theta$.

DESCRIPTION OF THE EMBODIMENTS

Figure 5:
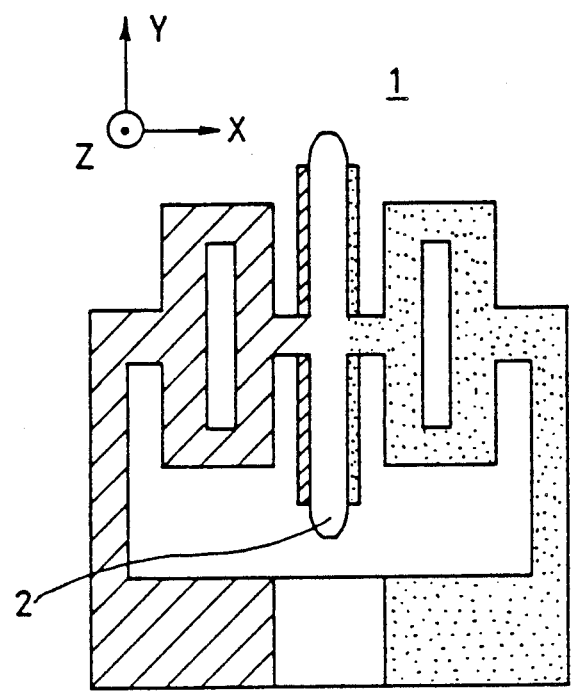
FIG. 5 is a plan view showing another embodiment of the inventive longitudinal quartz crystal resonator.

Next, the present invention is described in detail with reference to the drawings. FIG. 1 shows one embodiment of the longitudinal quartz crystal resonator according to the present invention, and FIG. 2 is a diagrammatic plan view of the FIG. 1 resonator to illustrate oscillating operation thereof. At first, referring to FIG. 2 for the description of the operational principle of the inventive resonator, the resonator 1 is comprised of a longitudinal vibrational portion 2 and a pair of supporting portions 3, which are fixed under boundary conditions at their opposite ends to a holding section. The vibrational portion 2 has a length $L_1$, width $W_1$ and thickness T, and each supporting portion 3 has a length $L_2$ and width $W_2$. As indicated by arrow A, when the vibrational portion 2 of the resonator 1 undergoes expanding displacement, a flexural section 5 of the supporting portion 3 accordingly undergoes flexural displacement inwardly as indicated by arrow B. On the other hand, when the vibrational portion 2 undergoes contracting displacement, the flexural section 5 of the supporting portion 3 undergoes accordingly flexural displacement outwardly. Namely, in the invention, the displacement of the vibrational portion 2 in the widthwise direction is converted into the flexural displacement of the supporting portion 3 to thereby avoid suppressing of the freedom of the vibration of the resonator.

Actually, there is an optimum dimension effective to avoid suppressing of the vibration. The optimum dimension and shape are determined according to the potential energy of the vibrational portion 2. The potential energy $U_1$ of the vibrational portion 2 and the other potential energy $U_2$ of the flexural sections 5 are indicated as following relations:

$$U_1 = \tfrac{1}{2} \int_{V_1} T_2 S_2 dV \tag{1}$$

$$U_2 = \tfrac{1}{2} \int_{V_2} E \cdot I \left( \frac{\partial^2 V}{\partial X^2} \right) dV \tag{2}$$

where $T_2$ denotes stress, $S_2$ denotes strain, E denotes Young's modulus, I denotes moment of inertia, V denotes displacement, $V_1$ and $U_2$ denote volume, and x denotes a coordinate value. In order to avoid suppression of the vibration of the longitudinal quartz crystal resonator, it is necessary to satisfy the following relation:

$$U_1 > U_2 \qquad (3)$$

The dimensions $L_2$, $W_2$ and T of the flexural sections 5 are determined according to the relation (3). For example, if the inventive resonator is designed to undergo oscillation at a frequency of 1 MHz, the dimension of the vibrational portion is set to length $L_1 = 2.6$ mm, width $W_1 = 80$ μm and thickness $T = 160$ μm. In such case, the dimensional ratio of $W_2/L_2$ of the flexural section 5 of each supporting portion 3 is set below 0.16 so as to sufficiently reduce the potential energy of the supporting portion as compared to that of the vibrational portion. By thus setting the dimension, there can be obtained a longitudinal quartz crystal resonator having a reduced equivalent series resistance and high Q value.

Next, the explanation is given why the vibration energy can be considerably reduced. As shown in the diagrammatic view of FIG. 2, the vibrational energy is transmitted from the vibrational portion 2 to each supporting portion 3 through a bridge portion 4. Therefore, it is advantageous to reduce the energy loss in the supporting sections 3. Since the vibration is converted into the flexural mode in the supporting portions 3, if the opposite ends of the flexural sections 5 have effective infinite mass, the energy of the flexural sections 5 of the supporting portions 3 is not transmitted to a mounting section (not shown) to thereby avoid loss of energy. Stated otherwise, in the present invention, the ratio $W_2/L_2$ is suitably selected to effect efficient conversion of the longitudinal oscillation mode of the vibrational portion 2, into the flexural oscillation mode of the supporting portions 3 so as to free the oscillation of the vibrational portion 2. At the same time, the flexural sections 5 undergoing flexural oscillation are held at its opposite ends by a holding section designed to have effective infinite mass.

Next, the description is given for a driving electrode effective to reduce the equivalent series resistance $R_1$. As shown by the coordinate system of the longitudinal quartz crystal resonator in FIG. 3 where the X-axis is electrical axis, Y-axis is mechanical axis and Z-axis is optical axis, the resonator undergoes displacement in the Y-direction. Accordingly, it is advantageous to provide a structure for electric field application effective to induce strain mainly in the Y-direction. In view of the piezoelectricity of the quartz crystal, the electric polarizations $P_x$, $P_y$ and $P_z$ in the X-, y- and Z- directions are represented as follows:

$$\begin{aligned} P_x &= e_{11}S_1 + e_{12}S_2 + e_{14}S_4 \\ P_y &= e_{25}S_5 + e_{26}S_6 \\ P_z &= 0 \end{aligned} \qquad (4)$$

where $e_{11}$, $e_{12}$, $e_{14}$, $e_{25}$ and $e_{26}$ denote piezoelectric coefficients and $S_1$, $S_2$, $S_4$, $S_5$ and $S_6$ denote strain. As apparent from the relation (4), in order to induce displacement in the Y-direction, the electric field should be applied so as to satisfy the first equation of the relation (4). Stated otherwise, electrodes should be provided on a face substantially perpendicular to the X-axis. Since the inventive longitudinal quartz crystal resonator has a complicated shape, it is formed by a chemical etching method. Therefore, the driving electrodes are provided on the etched face. The oscillating operation is explained hereabove, and next an embodiment of the present invention will be explained herebelow.

FIG. 1 shows one embodiment of the longitudinal quartz crystal resonator according to the present invention. The resonator 1 is comprised of a longitudinal vibrational portion 2 having an elongate shape, a pair of supporting portions 3 and a pair of bridge portions 4 connected therebetween, and is formed integrally by etching. Each supporting portion 3 is comprised of a flexural section 5, means defining an opening 7, a frame section 6 and a mounting section 8. The vibrational portion 2 undergoes expansion and contraction movement in the longitudinal or lengthwise direction thereof by external electric field driving, i.e., in response to an AC voltage applied to a pair of driving or actuating electrodes 9 and 10 formed on widthwise opposite sides of the vibrational portion 2. At the same time, the vibrational portion 2 undergoes the corresponding movement in the widthwise direction, i.e., in the direction along the pair of bridge portions 4. Firstly, in order to effect free oscillation of the vibrational portion 2 in the lengthwise direction, it is important to free sufficiently the concurrent widthwise oscillation along the bridge portions 4. For this, in the present invention, each flexural section 5 of the respective supporting portions 3 is coupled at its opposite ends to a parallel connecting or opposed section 5a such that an opening 7 is formed between the flexural section 5 and the opposed connecting section 5a so as to enable the flexural section 3 to undergo sufficiently free flexural oscillation in the widthwise direction. Further, the ratio of length to width of the flexural section 5 is suitably set below, for example, 0.16 in case of the oscillating frequency of about 1 MHz so as to substantially avoid suppression of the oscillation in the lengthwise direction.

Next, with regard to the energy loss of vibration, the resonator 1 is comprised of the vibrational portion 2, the bridge portion 4 and the flexural section 5 connected in series to each other and formed integrally with each other by etching, and the opening 7 is formed between the flexural section 5 and the adjacent connecting section, which are formed into a rectangular shape with the opening 7 so as to enable the flexural section 5 to undergo sufficiently the oscillation. Further, each connecting section is coupled to the frame section 6 through a transverse arm section and the frame section 6 is extended in the lengthwise direction to connect with the mounting section 8. Thus, the resonator 1 is mounted and fixed at the mounting section 8, while the longitudinal quartz crystal resonator does not exhibit loss of vibrational energy.

Further, with regard to the arrangement of electrodes, the effective segments of the driving electrodes 9 and 10 are formed on the widthwise opposed side faces of the vibrational portion 2. The driving electrode 9 is extended therefrom through a major face of the flexural section 5 and is connected to a lead electrode 12 which is formed on the outer frame section 6 and extended to the mounting section 8. In similar manner, the other driving electrode 10 is also extended through at least a major face of the other corresponding flexural section 5 and connected to another lead electrode 11 which is formed on the other outer frame section 6 and is extended to the common mounting section 8. Consequently, an AC voltage is applied between the pair of electrodes 9 and 10 to excite and maintain the longitudinal oscillation of the resonator.

FIG. 3 shows a coordinate system assigned to the longitudinal quartz crystal resonator of the present invention. The vibrational portion of the longitudinal quartz crystal resonator has the dimension of length $L_1$, width $W_1$ and thickness T as shown in FIG. 2. The first order or linear temperature coefficient $\alpha$ and the second order temperature coefficient $\beta$ can be calculated as the function of the cut angle $\theta$ and the dimensional ratios $T/L_1$ and $W_1/L_1$. These are calculated at a given temperature of 20° C. in the embodiment. Accordingly, a peak temperature $T_p$ is calculated according to the following relation:

$$T_p = 20 - \frac{\alpha}{2\beta} \tag{5}$$

FIG. 4 shows the relationship between the cut angle $\theta$ around the X-axis in the coordinate system of the resonator shown in FIG. 3 and the peak temperature $T_p$ in case of the dimensional ratios $T/L_1=0.062$ and $W_1/L_1=0.0305$. When the cut angle $\theta$ is $-2°$, the peak temperature $T_p$ is $-10°$ C. The greater the value of $\theta$, the greater the value of $T_p$. When the cut angle $\theta$ is 0°, the peak temperature $T_p$ is about 21° C. When the cut angle $\theta$ is $+4°$ C., the peak temperature $T_p$ is 60° C. As described, the peak temperature $T_p$ is freely set according to cut angle $\theta$ so as to set the desired value according to the requirement. In the present invention, the cut angle $\theta$ is appropriately selected to adjust the peak temperature $T_p$ in the range of $-10°$ C. to $+60°$ C. Namely, the cut angle $\theta$ is set between $-2°$ and $+4°$. Therefore, there can be obtained a longitudinal quartz crystal resonator having a small frequency change especially in the range from $-10°$ C. to $+60°$ C.

FIG. 5 shows another embodiment according to the present invention. The longitudinal vibrational portion 2 has tapered end sections which have a width smaller than that of the center portion. By such shape or configuration, the effective mass of the vibrational portion can be reduced so as to increase the oscillating frequency without reducing the length of the vibrational portion 2.

As described above, according to the present invention, in the longitudinal quartz crystal resonator comprised of a vibrational portion and a supporting portion formed integrally with each other by an etching method, the improved longitudinal quartz crystal resonator having a new shape is constructed to achieve the following remarkable effects.

The shape and dimension of the supporting portion is suitably designed to free the oscillation to thereby reduce equivalent series resistance $R_1$.

An absorbing opening is provided between the flexural section and the adjacent connecting section to the frame to thereby free the oscillation of the vibrational portion and to thereby block the transfer of the energy from the flexural section to the frame section to eliminate energy loss of vibration to realize the longitudinal quartz crystal resonator having a small value of $R_1$ while being mounted and fixed at the mounting section.

The driving electrodes are provided on a sideface substantially perpendicular to the X-axis to thereby increase the electric field efficiency and to thereby achieve small value of $R_1$.

The cut angle $\theta$ is suitably selected to set the zero temperature coefficient to thereby reduce the change in the oscillating frequency in the wide temperature range.

The top end sections of the vibrational portion can be tapered such that the width of top end sections is smaller than that of the center section to thereby increase the oscillating frequency without reducing the length of the vibrational portion.

The resonator can be mounted at one side thereof to thereby simplify the production process and to reduce the size thereof.

What is claimed is:

1. A longitudinal quartz crystal resonator comprising:
   a vibrational portion having a longitudinal shape and a pair of opposed widthwise side sections;
   a pair of bridge portions connected to the respective widthwise side sections of the vibrational portion; and
   a supporting portion connected to the bridge portions to support the vibrational portion and formed integrally with the vibrational and bridge portions by etching, the supporting portion comprising a pair of flexural sections connected to respective ones of the bridge portions, each flexural section being connected to an opposed connecting section and defining therewith an opening surrounded by the flexural and connecting sections, a pair of frame sections connected to respective ones of the connecting sections, and a mounting section connected to the pair of frame sections;
   wherein the widthwise side sections of the vibrational portion extended substantially perpendicular to the X-axis of the resonator, and driving electrodes disposed on the widthwise side sections.

2. A longitudinal quartz crystal resonator according to claim 1; wherein the pair of frame sections extend parallel to the vibrational portion on opposite sides thereof, and the mounting section is connected to respective ends of the frame sections in spaced relation from one end of the vibrational portion.

3. A longitudinal quartz crystal resonator comprising:
   a vibrational portion having a longitudinal shape and a pair of opposed widthwise side sections;
   a pair of bridge portions connected to the respective widthwise side sections of the vibrational portion; and
   a supporting portion connected to the bridge portions to support the vibrational portion and formed integrally with the vibrational and bridge portions by etching, the supporting portion comprising a pair of flexural sections connected to respective ones of the bridge portions, each flexural section being connected to an opposed connecting section and defining therewith an opening surrounded by the flexural and connecting sections, a pair of frame sections connected to respective ones of the connecting sections, and a mounting section connected to the pair of frame sections;
   wherein the quartz crystal resonator comprises a quartz crystal plate having a cut angle from $-2°$ to $+4°$ around the X-axis with respect to a Z-plate of the quartz crystal.

4. A longitudinal quartz crystal resonator comprising:
   a vibrational portion having a longitudinal shape and a pair of opposed widthwise side sections;
   a pair of bridge portions connected to the respective widthwise side sections of the vibrational portion; and
   a supporting portion connected to the bridge portions to support the vibrational portion and formed integrally with the vibrational and bridge portions by etching, the supporting portion comprising a pair of flexural sections connected to respective ones of the bridge portions, each flexural section being connected to an opposed connecting section and defining therewith an opening surrounded by the flexural and connecting sections, a pair of frame sections connected to respective ones of the connecting sections, and a mounting section connected to the pair of frame sections;

wherein the vibrational portion has a pair of lengthwise tapered end portions.

5. A longitudinal quartz crystal resonator comprising:

a vibrational portion having a longitudinal shape and a pair of opposed widthwise side sections;

a pair of bridge portions connected to the respective widthwise side sections of the vibrational portion; and a supporting portion connected to the bridge portions to support the vibrational portion and formed integrally with the vibrational and bridge portions by etching, the supporting portion comprising a pair of flexural sections connected to respective ones of the bridge portions, each flexural section being connected to an opposed connecting section and defining therewith an opening surrounded by the flexural and connecting sections, a pair of frame sections connected to respective ones of the connecting sections, and a mounting section connected to the pair of frame sections;

wherein the flexural sections have a longitudinal shape arranged parallel to the vibrational portion and have a dimensional ratio of width to length set below 0.16.

6. A longitudinal quartz crystal resonator comprising: an etched quartz crystal having a vibrational portion having an elongate shape, two bridge portions connected to opposite widthwise sides of the vibrational portion, and a supporting portion connected to the two bridge portions to support the vibrational portion to undergo vibratory longitudinal expansion and contraction, the supporting portion comprising two flexural sections connected to respective ones of the bridge portions, two opposed sections disposed in opposed spaced-apart relation from respective ones of the flexural sections and extending in the same general direction as the flexural sections, each pair of spaced-apart flexural and opposed sections being interconnected at their opposite ends to enable the flexural sections to undergo widthwise flexure in accordance with the longitudinal vibration of the vibrational portion, two frame sections connected to respective ones of the opposed sections, and a mounting section connected to the frame sections to enable mounting of the supporting portion; and driving electrodes disposed on the widthwise sides of the vibrational portion for exciting the vibrational portion into longitudinal vibration.

7. A longitudinal quartz crystal resonator according to claim 6; wherein the vibrational portion has a pair of lengthwise tapered end portions.

8. A longitudinal quartz crystal resonator according to claim 6; wherein the flexural sections have a width-to-length ratio less than 0.16.

9. A longitudinal quartz crystal resonator according to claim 6; wherein the etched quartz crystal comprises an etched quartz crystal plate having a cut angle from $-2°$ to $+4°$ around the X-axis with respect to a Z-plate of the quartz crystal.

10. A longitudinal quartz crystal resonator according to claim 6; wherein the opposite widthwise sides of the vibrational portion are substantially perpendicular to the X-axis of the quartz crystal.

11. A longitudinal quartz crystal resonator according to claim 6; wherein the two frame sections extend generally parallel to the vibrational portion.

12. A longitudinal quartz crystal resonator according to claim 11; wherein the mounting section is connected to respective ends of the frame sections in spaced relation from one end of the vibrational portion.

13. A longitudinal quartz crystal resonator according to claim 6; wherein the mounting section is connected to the two frame sections in spaced relation from one end of the vibrational portion.

14. A longitudinal quartz crystal resonator according to claim 6; including lead electrodes disposed on the supporting portion and connected to the driving electrodes for applying an exciting voltage to the driving electrodes.

* * * * *